(12) United States Patent
Watanabe et al.

(10) Patent No.: US 7,659,623 B2
(45) Date of Patent: Feb. 9, 2010

(54) SEMICONDUCTOR DEVICE HAVING IMPROVED WIRING

(75) Inventors: Yuji Watanabe, Tokyo (JP); Koji Hosokawa, Tokyo (JP); Hisashi Tanie, Ibaraki (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/815,084

(22) PCT Filed: Apr. 7, 2006

(86) PCT No.: PCT/JP2006/307871

§ 371 (c)(1),
(2), (4) Date: Jul. 30, 2007

(87) PCT Pub. No.: WO2006/109857

PCT Pub. Date: Oct. 19, 2006

(65) Prior Publication Data

US 2008/0150115 A1    Jun. 26, 2008

(30) Foreign Application Priority Data

Apr. 11, 2005  (JP) .............................. 2005-113413

(51) Int. Cl.
H01L 23/488 (2006.01)
H01L 23/48 (2006.01)
H01L 25/07 (2006.01)
H01L 23/12 (2006.01)
H01L 25/065 (2006.01)
H01L 25/18 (2006.01)

(52) U.S. Cl. .............. 257/737; 257/E23.023; 257/E23.069; 257/E23.07; 257/E25.023; 257/E23.063; 257/E23.067; 257/E21.511; 257/668; 257/686; 257/778; 257/738; 257/691; 257/208; 257/211; 257/735

(58) Field of Classification Search ................. 257/686, 257/685, 678, 691, 738, 737, E23.023, E23.069, 257/E23.07, E25.023, 735, E21.511, 668, 257/208, 211, E23.062, E23.063, E23.067
See application file for complete search history.

(56) References Cited

U.S. PATENT DOCUMENTS

| 6,528,734 B2 * | 3/2003 | Mizunashi ................. 174/255 |
| 6,736,306 B2 * | 5/2004 | Byun et al. ............ 228/180.22 |
| 7,446,398 B2 * | 11/2008 | Niu et al. .................... 257/668 |
| 2001/0028114 A1 * | 10/2001 | Hosomi ...................... 257/778 |
| 2002/0139571 A1 * | 10/2002 | Mizunashi ................. 174/255 |
| 2003/0060035 A1 * | 3/2003 | Kimura et al. ............. 438/626 |

(Continued)

FOREIGN PATENT DOCUMENTS

JP     2000-22034 A     1/2000

(Continued)

Primary Examiner—Alexander O Williams
(74) Attorney, Agent, or Firm—Sughrue Mion, PLLC

(57) ABSTRACT

An electronic component such as a semiconductor device is provided which is capable of preventing wiring breakage in a stress concentration region of surface layer wiring lines. In a semiconductor device provided with a support ball (5), no ordinary wiring line is formed in a region (7(A)) in the vicinity of the support ball (5) and a region (7(B)) at the end of the semiconductor chip facing the support ball (5), which are the stress concentration regions of the package substrate (2). Instead, a wiring line (6(C)) is formed away from these regions or a wide wiring line is formed in these regions.

21 Claims, 9 Drawing Sheets

U.S. PATENT DOCUMENTS

| | | | |
|---|---|---|---|
| 2004/0070080 A1* | 4/2004 | Pendse | 257/778 |
| 2005/0056944 A1* | 3/2005 | Pendse et al. | 257/778 |
| 2005/0167831 A1* | 8/2005 | Tsubosaki | 257/737 |
| 2006/0001179 A1* | 1/2006 | Fukase et al. | 257/778 |
| 2006/0012054 A1* | 1/2006 | Memis | 257/778 |
| 2006/0049504 A1* | 3/2006 | Corisis et al. | 257/686 |
| 2006/0079020 A1* | 4/2006 | Omizo et al. | 438/107 |
| 2006/0208348 A1* | 9/2006 | Ohsaka et al. | 257/685 |
| 2006/0214299 A1* | 9/2006 | Fairchild et al. | 257/758 |
| 2007/0224729 A1* | 9/2007 | Reiss et al. | 438/106 |

FOREIGN PATENT DOCUMENTS

| | | |
|---|---|---|
| JP | 2003-318361 A | 11/2003 |
| JP | 2004-214403 A | 7/2004 |
| WO | 03/017367 A1 * | 2/2003 |

* cited by examiner

SEMICONDUCTOR DEVICE HAVING IMPROVED WIRING

TECHNICAL FIELD

The present invention relates to an electronic component such as a semiconductor device, and particularly to a semiconductor device having an electronic element chip such as a semiconductor chip mounted on a BGA (Ball Grid Array) substrate.

BACKGROUND ART

There is a trend to downsize packages along with recent evolutions of semiconductor devices involving increase of the operation speed and large-scale integration. One of known technologies for package downsizing is a surface mount type ball grid array (hereafter abbreviated to BGA) in which solder balls are arranged on a package substrate.

There are two types of BGA semiconductor devices having a semiconductor chip mounted on a BGA package substrate. One is a semiconductor device in which a pad functioning as an electrode for the semiconductor chip is adhesively fixed on a package substrate in a face up state, and the pad is connected to a surface layer wiring line on the substrate by means of bonding wire, and the other is a semiconductor device in which a bump or a tape lead formed as an electrode on a surface of the semiconductor chip is connected to a wiring pattern formed on the upper surface of a package substrate in a face down state. The former type of semiconductor device is described for example in Japanese Laid-Open Patent Publication No. H11-163201 (patent document). This patent document points out that, when this type of BGA semiconductor device is exposed to temperature change, there occurs breakage in surface layer wiring lines at a position on a package substrate intersecting with a visible outline defined by an end of a semiconductor chip disposed on the package substrate. This wiring breakage tends to occur in a region where a long side of the semiconductor chip intersects with the wiring. The patent document discloses, as a countermeasure against such wiring breakage, that the wiring breakage can be prevented by increasing the width of wiring in a region crossing the long side of the chip.

As for the latter type of BGA semiconductor devices, a type of BGA package in which a semiconductor chip is fixed to a package substrate by flip-chip connection while no underfill is disposed between the chip and the substrate will be effective countermeasure for avoiding the breakage of substrate surface layer wiring lines as pointed out by the patent document.

For the purpose of package downsizing, a multi chip package (hereafter abbreviated to MCP) has been developed, in which a plurality of chips are mounted on a package substrate in a two-dimensional or three-dimensional fashion, or package substrates having a chip mounted thereon are stacked three-dimensionally. The three-dimensionally stacked MCP is particularly effective for package downsizing. In the course of development of package stacked MCPs having packages stacked three-dimensionally, the present inventor has newly found an unenvisaged problem caused by wiring breakage.

Referring to FIGS. 1(A), 1(B) and 1(C) showing a semiconductor device to be discussed, signal balls 4 are disposed in a region defined by a contour 11 formed by a substrate chip, whereas support balls 5 support an overhung portion of the package substrate extending outside of the region defined by the contour formed by the chip. This means that the support balls ensures transverse strength for the package and increases its mechanical strength. In FIG. 1 (A), two support balls 5 are disposed at each of four places on the short sides of the package substrate 2.

A temperature cycle test conducted on a semiconductor device having a chip mounted on this package substrate revealed that wiring breakage would occur in package surface layer wiring lines 6(B) located in the vicinity of the support balls 5. There was found no wiring breakage in package surface layer wiring lines 6(A) not in the vicinity of the support balls 5. The wiring breakage was observed in the vicinity of the support balls 5 and in the region indicated by oblique lines in FIG. 1(B), which is an end of the semiconductor chip facing the support ball 5. Thus, it was found that the portion indicated by the oblique lines constitutes a wiring breakage prone region 10. Such wiring breakage will cause malfunction of the semiconductor device.

DISCLOSURE OF THE INVENTION

In view of the problems described above, it is therefore an object of the present invention to provide an electronic component having improved reliability for conductive wiring lines, by preventing breakage in package substrate wiring disposed in the vicinity of support balls on a package substrate.

The present invention provides an electronic component having an electronic element chip mounted on a package substrate having wiring lines formed thereon. The electronic component includes: a first ball for supporting the package substrate, being disposed on the rear surface of the package substrate inside a region defined by the contour of the outline of the electronic element chip on the package substrate; and a second ball for supporting the package substrate, being disposed outside of the region. No wiring with an ordinary width is formed in a first region in the vicinity of the surface position of the package substrate facing the second ball.

The electronic component includes a module substrate fixing the package substrate by means of the signal ball and the support ball.

Desirably, no wiring with an ordinary width is formed in a second region which is on the surface of the package substrate in the vicinity of the contour defined by the outline of the electronic element chip.

Preferably, the first ball is a signal ball for conducting electricity, and the second ball is a support ball.

Desirably, the support ball is arranged outwardly away from the contour defined by the outline of the electronic element chip by a distance corresponding to a diameter of a ball land for the support ball on the package substrate side.

More specifically, the first region has dimensions corresponding to two ball lands on the package substrate side extending from the center of the support ball in a first direction of the contour defined by the electronic element chip outline and corresponding to three ball lands on the package substrate side including one ball land each extending vertically up and down from the support ball in a second direction orthogonal to the first direction.

Preferably, the second region has dimensions corresponding to one ball land on the package substrate side in the first direction and dimensions corresponding to three ball lands in the second direction, with the center being positioned on the contour of the electronic element chip outline.

A wide wiring line with a width greater than an ordinary width may be disposed adjacent to the first and second regions.

A wide wiring line with a width greater than an ordinary width may be disposed may be disposed in the second region.

A wide wiring line with a width greater than an ordinary width may be disposed in the first and second regions.

The wide wiring line is used as a power supply wiring, a ground wiring, or a reference voltage wiring.

The wide wiring line preferably has a width of 200 μm or greater.

The present invention also provides an electronic component including an upper package stacked above the package. The upper package includes: an upper package substrate having an electronic element chip mounted thereon; upper package substrate supporting means disposed on the rear surface of the upper package corresponding to the inside of the contour defined by the outline of the electronic element chip; and a signal ball located outside the contour defined by the outline of the electronic element chip to support the upper package substrate. No wiring with an ordinary width is formed in a first region on the surface of the upper package substrate corresponding to the vicinity of the position of the signal ball and a second region located on the surface of the upper package substrate in the vicinity of the contour defined by the outline of the electronic element chip.

An adhesive applied to fill the gap between the package and the upper package may be used as the upper package supporting means.

A signal ball may be disposed between the package and the upper package as the upper package supporting means.

A wide wiring line with a width greater than an ordinary width may be disposed close to the first and second regions of the upper package.

A wide wiring line with a width greater than an ordinary width may be disposed in the second region of the upper package.

A wide wiring line with a width greater than an ordinary width may be disposed in the first and second regions of the upper package.

In the electronic component according to the present invention, no package surface layer wiring line is formed in the stress concentration region in the vicinity of the support ball on the package substrate where the electronic element chip is disposed. Alternatively, a wide wiring line may be formed in the stress concentration region. These configurations make it possible to prevent breakage of package surface layer wiring lines in the vicinity of the support ball on the package substrate, and thus to obtain an electronic component having improved reliability for conductive wiring lines.

BEST MODE FOR CARRYING OUT THE INVENTION

The present invention will be described in detail with reference to the drawings. In the description of embodiments, a semiconductor device is taken up as an electronic component, and the description will be made of a case in which a typical semiconductor chip is used as an electronic element chip. However, the electronic element chip is not limited to a semiconductor chip, but may be a chip capacitor, an optical semiconductor element chip, an MEMS (Micro-Electro-Mechanical-System) chip or the like.

A first embodiment of the present invention will be described with reference to FIG. 2, FIG. 3 and FIG. 4.

Figure 2:
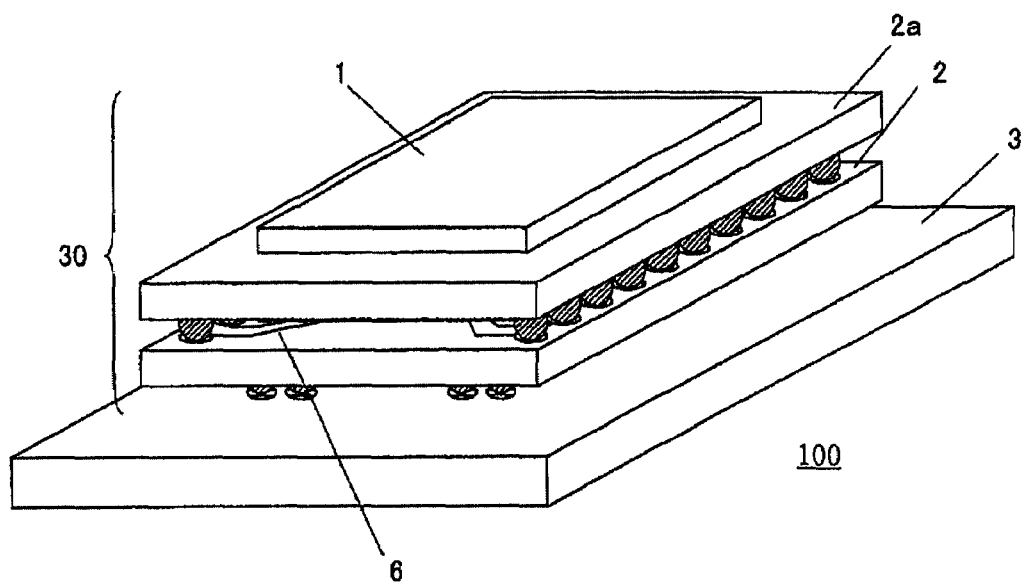
FIG. 2 is a perspective view showing a multi-module package semiconductor device according to a first embodiment of the present invention.
Figure 3:
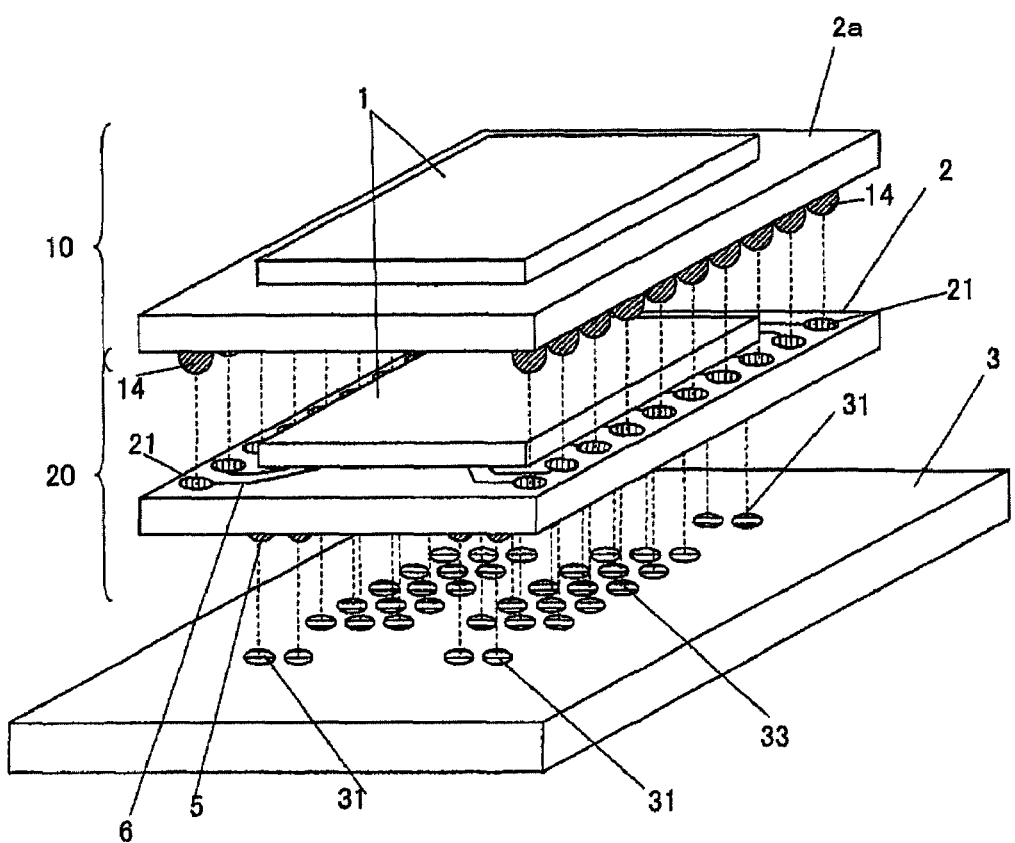
FIG. 3 is an exploded perspective view of FIG. 1, according to the first embodiment to the present invention.

Referring to FIG. 2, a semiconductor device 100 of the present invention includes a stacked package 30 mounted on a module substrate 3. Referring to FIG. 3 together with FIG. 2, the stacked package 30 includes an upper package 10 and a lower package 20. In the upper package 10 and the lower package 20, semiconductor chips 1 are flip-chip connected to package substrates 2a and 2, respectively, in a face-down fashion. The lower package 20 has a surface layer wiring line 6 formed on the upper surface of the substrate 2 and connected to a land 21. The surface layer wiring line 6 extends to the lower surface of the chip 1. The surface layer wiring line has an ordinary width of 100 μm or less. A solder ball 14 is fixed to a land formed on the lower surface of the substrate 2a of the upper package 10, and this ball is also connected and fixed to the land 21 on the upper surface of the substrate 2 of the lower package 20. The solder ball 14 forms an electrical path for signals or supply voltage between the upper package 10 and the lower package 20. A land (not shown) is formed on the lower surface of the substrate 2, and a solder ball 5 is fixed to this land.

Figure 4:
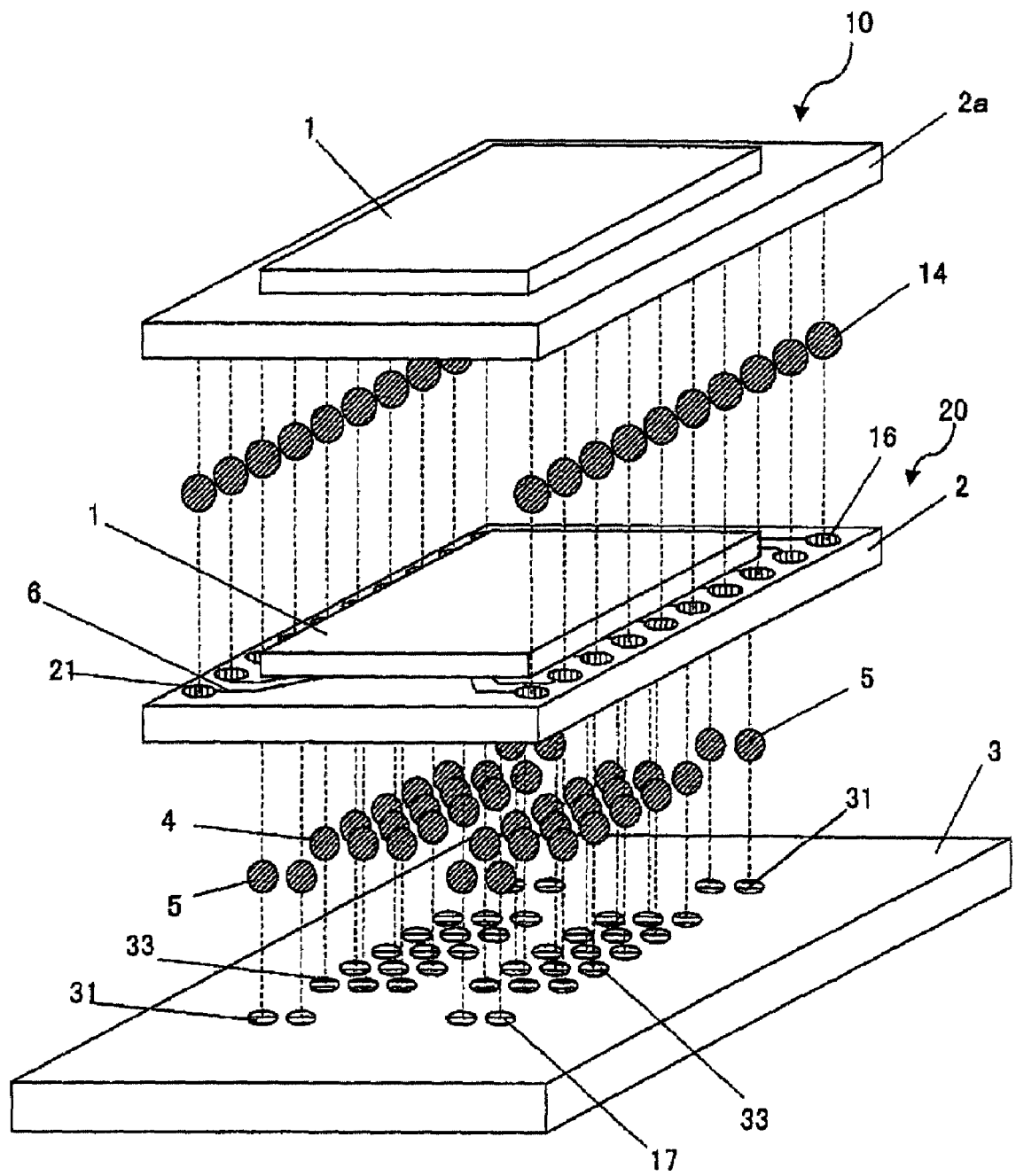
FIG. 4 is an exploded perspective view of FIG. 2, according to the first embodiment of the present invention.

Referring also to FIG. 4, a ball 4 in addition to the ball 5 is disposed on the lower surface of the substrate 2. The ball 4 is disposed in an inner region of a contour formed by the semiconductor chip 1 on the substrate 2 (inner region defined by the chip), and connected to a land 33 arranged at a position corresponding thereto on a module substrate. On the other hand, the ball 5 is disposed outside of the region defined by the chip, and connected to a corresponding land 31 on the module substrate 3. The ball 4 holds the substrate 2 and the module substrate 3 while giving an electrical connection therebetween, whereas the ball 5 supports an overhung portion outside of the region defined by the chip on the substrate 2 to prevent deformation of the substrate.

In FIG. 4, two pairs of balls 5 are disposed on each short side of the module substrate 3, that is, four pairs of balls 5 in total are disposed on the module substrate 3. The balls 5 fix the respective corresponding lands 31 and lands (not shown) disposed outside of the region defined by the chip on the lower surface of the substrate 2.

The surface layer wiring line 6 on the substrate 2 is formed avoiding a proximity region on the upper surface of the substrate 2 corresponding to the region where the balls 5 are disposed, or a predetermined region under the contour of the chip facing the proximity region. Thus, according to the first embodiment of the present invention, the surface layer wiring line is formed avoiding these regions, so that the surface layer wiring line of the substrate will not be broken during temperature cycles to cause malfunction.

The positional relationship will be described in more detail with reference to FIGS. 5(A) to 5(C).

Figure 5:
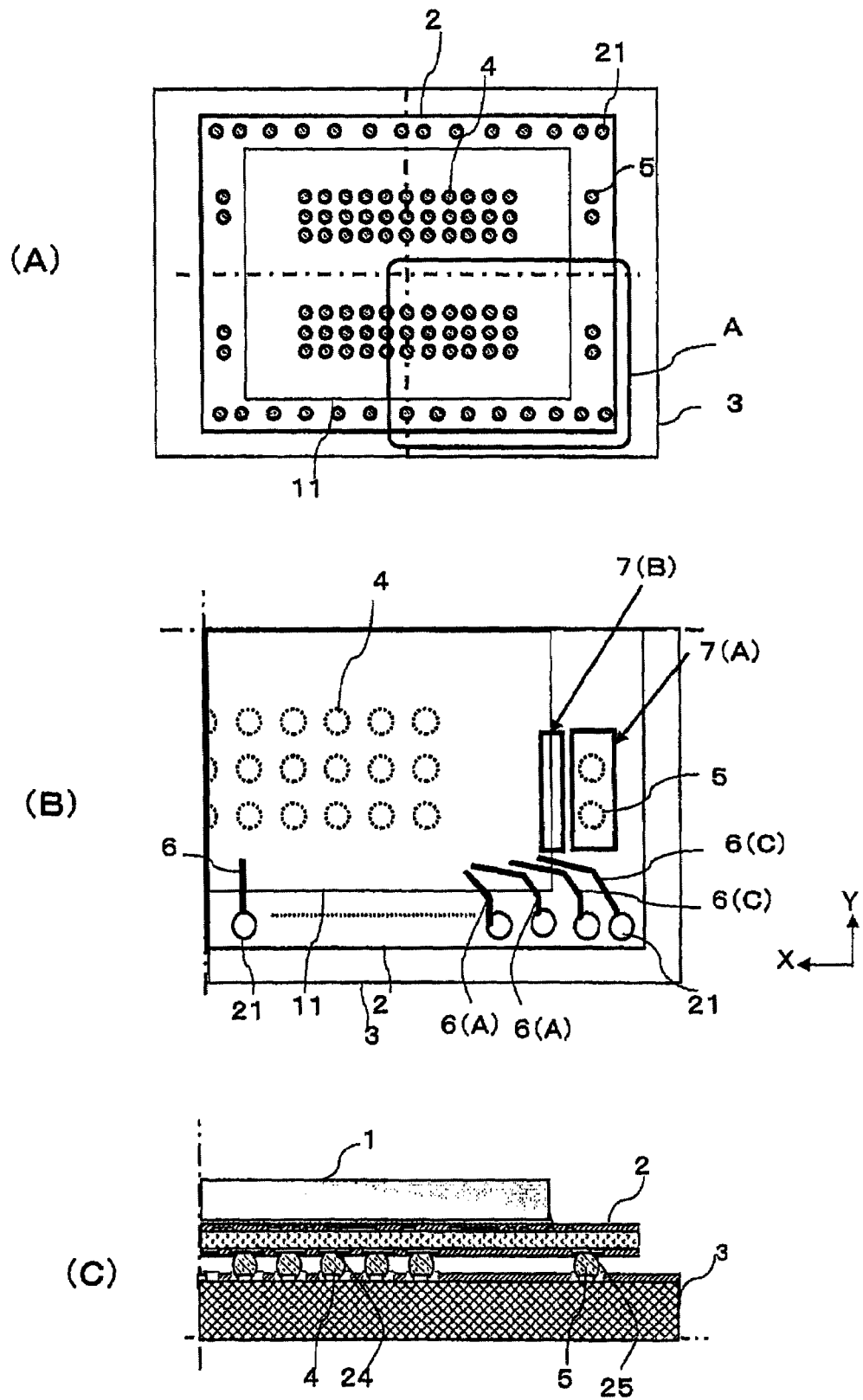
FIG. 5 shows the first embodiment of the present invention, (A) being a schematic plan view of a lower package, (B) being an enlarged partial plan view of (A), and (C) being a cross-sectional view of (B)

FIG. 5 shows a state in which the upper package 10 has been removed from FIG. 2. FIG. 5(A) is a plan view as viewed from the top with the semiconductor chip further removed for the convenience of illustration. FIG. 5(B) is an enlarged partial plan view thereof. FIG. 5(C) shows a cross section taken along vertically to the sheet surface of FIG. 5(B) along a straight line connecting the ball 5 and a plurality of the balls 4, located closest to the lower side of the substrate 2.

Referring to FIGS. 5(A), 5(B) and FIG. 5(C), the semiconductor chip 1 is disposed on the surface of the package substrate 2 in a face down fashion, and the package substrate 2 is provided with wiring for electrical connection. The package substrate 2 is further connected and fixed to the module substrate 3 by means of the signal balls 4 and the support balls 5. The signal balls 4 are solder balls, for example, for power supply and signal lines. The support balls 5 are solder balls for supporting the package substrate 2 and for reinforcing the mechanical strength. Accordingly, the support balls 5 need not be electrically connected with the outside. When the package substrate is larger than the region where the signal balls 4 are disposed, the support balls 5 are arranged in the overhung portion of the package substrate 2 to ensure the transverse strength for the package, while being supported by the mechanical strength. The support balls 5 are disposed in pairs at four places along the short sides of the package substrate 2, parallel to the semiconductor chip.

Referring to FIG. 5(B), no package surface layer wiring line is formed in the vicinity of the support balls 5, whereas a package surface layer wiring line 6(C) is formed, bypassing the support balls 5. The package surface layer wiring lines 6(A) and 6(C) are used as power supply and signal lines for the upper package substrate. The package surface layer wiring lines 6(A) and 6(C) are formed of lands and wiring lines. The signal balls 4 are disposed inside the contour of the semiconductor chip while the support balls 5 are disposed outside the contour of the semiconductor chip, so that the package substrate 2 and the module substrate 3 are joined and fixed to each other.

The signal balls 4 are arranged on package-side signal ball lands 24 provided on the rear surface of the package substrate 2, and on signal ball lands 33 on the module substrate 3 (see FIG. 4). Similarly, the support balls 5 are arranged on package-side support ball lands 25 provided on the rear surface of the package substrate 2 and on signal ball lands 31 on the module substrate (see FIG. 4). The signal balls 4 and the support balls 5 are solder balls having a diameter of 0.4 mm, for example, and the pitch distance thereof is 0.8 mm. The package-side signal ball lands 24 and the package-side support ball lands 25 on which these solder balls are disposed also have a diameter of 0.4 mm. The package-side signal ball lands 24 and the package-side support ball lands 25 shall be generally referred to as the package-side ball lands.

Figure 1:
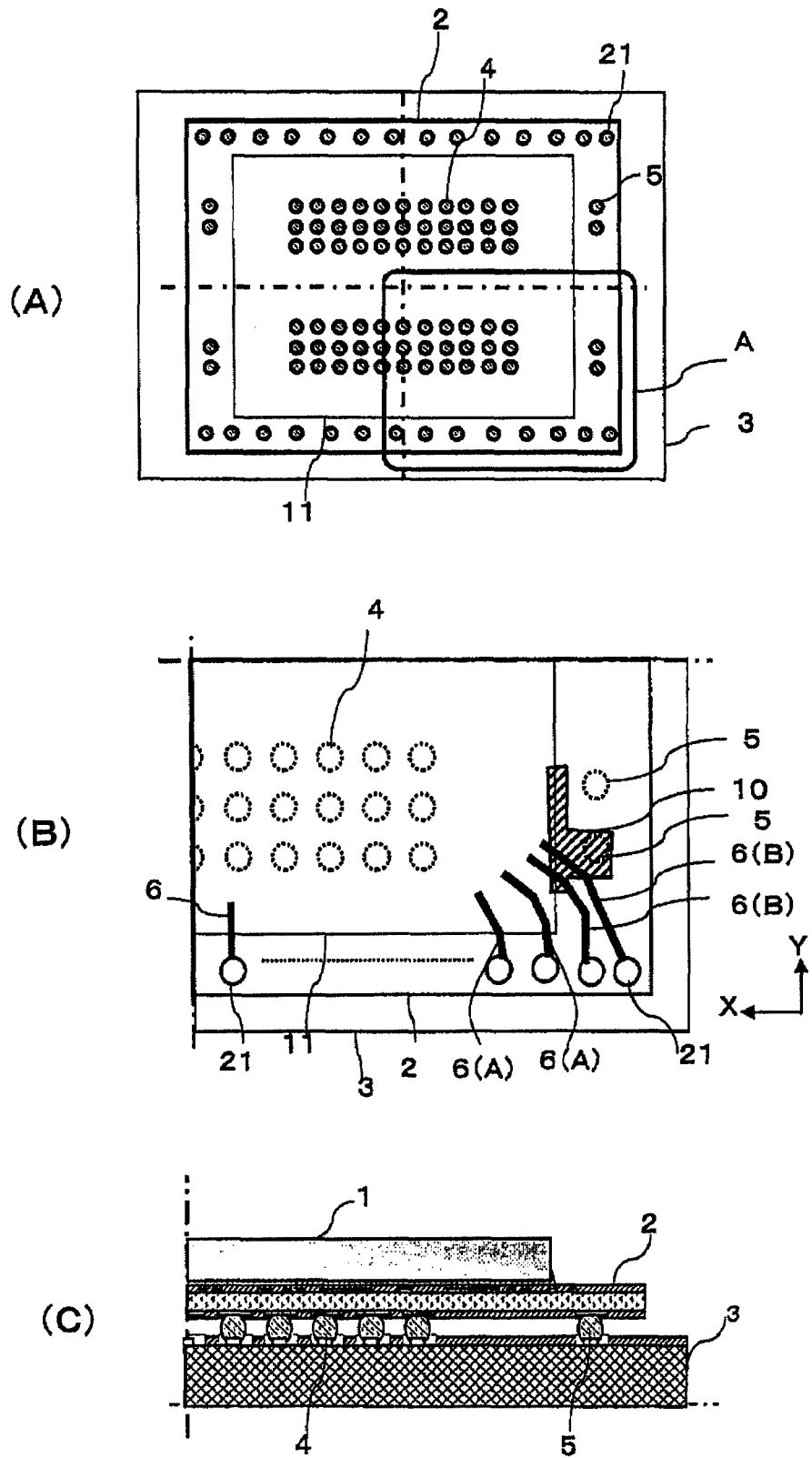
FIG. 1 shows diagrams for explaining the problem to be solved by the present invention, (A) being a schematic overall plan view, (B) being a partial plan view, and (C) being a cross-sectional view of a lower package.

According to the first embodiment, a first wiring prohibited region 7(A) is defined on the surface of the package substrate 2 by the region where the support balls 5 are located on the lower surface thereof and the vicinity region thereof. A second wiring prohibited region 7(B) is defined by a predetermined region under the contour of the semiconductor chip facing the first wiring prohibited region. No surface layer wiring lines are drawn in these wiring prohibited regions, that is, the surface layer wiring lines are formed bypassing these regions. This means that, the surface layer wiring lines are not formed like the wiring line 6(B) in FIG. 1, but the surface layer wiring lines 6(C) are formed at the positions shown in FIG. 5(B).

A temperature cycle test conducted on the semiconductor device of this embodiment revealed that no breakage occurred in the package surface layer wiring lines 6(C) formed to bypass the vicinity of the support balls 5. Naturally, there occurred no breakage either in the package surface layer wiring lines 6(A) formed on an inner side thereof. Thus, the semiconductor device having high reliability was obtained by forming the wiring lines to bypass the wiring prohibited region 7(A) and the wiring prohibited region 7(B).

Figure 6:
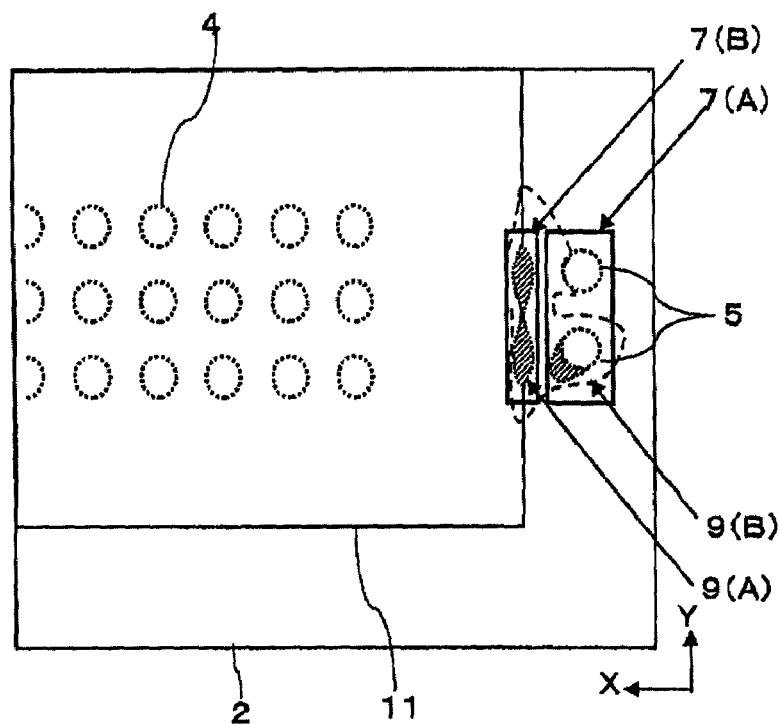
FIG. 6 is a partial plan view showing a stress concentration region according to the present invention.

Referring to FIG. 6, a description will be made of the findings obtained as a result of studies on the intensity of stress generation in the package substrate in order to quantify the mechanism of breaking the wiring lines on the package substrate, and the wiring prohibited regions. Like the partial plan view of FIG. 5(B), FIG. 6 also shows the region enclosed by the lines A. In FIG. 6, the indication of the module substrate is omitted. In FIG. 6, the whole upper surface of the package substrate 2 is represented as a solid surface layer wiring line, and a result of simulation analysis of stress applied to the package surface layer wiring line is shown together. As a result of the simulation analysis, high stress was observed in the support balls 5 and in a semiconductor chip end facing the support balls 5. The signal balls 4 and the support balls 5 used in this test had a diameter of 0.4 mm, and are arranged at a pitch distance of 0.8 mm. The package substrate was a substrate principally composed of polyimide.

As shown in FIG. 6, the highest stress was observed in a region 9(A) indicated by the oblique lines, and the second highest stress was observed in a region 9(B) enclosed by the broken line. It can be seen that the region 9(A) indicated by the oblique lines is similar to the wiring breakage region 10 shown in FIG. 1(B). In other words, the wiring breakage region 10 is a stress concentration region. The semiconductor device according to this embodiment is a moldless semiconductor device, in which no resin is disposed on the upper surface of the substrate 2 including the semiconductor chip 1 and in the space between the package substrate 2 and the module substrate 3. When this semiconductor device is subjected to a temperature cycle test, the semiconductor device will repeat warpage deformation, along with temperature change, due to difference in the coefficient of linear expansion among the semiconductor chip 1, the package substrate 2, and the module substrate 3. Since the end of the package substrate 2 is restrained by the support balls 5, the support balls 5 serve as support bars protecting the package substrate 2 against the warpage deformation, and support the package substrate 2.

Therefore, in the part of the package substrate extending beyond the end of the semiconductor chip 1, high bending stress is produced at a support of the support balls 5, and the stress is concentrated in the vicinity of the support balls 5, and in the semiconductor chip end facing the support balls 5. It can be seen that the occurrence of wiring breakage is concentrated in the wiring lines formed in the region where the warpage deformation is repeated and the stress is concentrated. The vicinity region of the support balls 5 where the stress is concentrated is defined as a wiring prohibited region 7(A), and the end of the semiconductor chip facing the support balls 5 is defined as a wiring prohibited region 7(B). The wiring lines 6(C) are formed to bypass these stress concentration regions, whereby the wiring breakage can be prevented.

Further, consideration is given to the first wiring prohibited region 7(A) and the second wiring prohibited region 7(B). Among the stress concentration regions shown in FIG. 6, the region 9(A) indicated by the oblique lines where the highest stress is concentrated is composed of a region extending from the support ball 5 closer to the corner of the substrate 2 to the semiconductor chip end and a region of the semiconductor chip end at a position facing the support balls 5. The region 9(B) where the second highest stress is concentrated is a region surrounding the highest stress concentration region 9(A) and is indicated by the broken line. The second region 9(B) extends slightly in the direction to the semiconductor chip, and does not stretch significantly in that direction. The first stress concentration region 9(A) is a region where wiring breakage will occur if wiring lines are formed, whereas the second stress concentration region 9(B) is a risky region where wiring breakage is prone to occur. In the first embodiment of the present invention, therefore, the wiring prohibited region 7(A) and the wiring prohibited region 7(B) are set around the stress concentration region 9(A).

Based on the size and position of the stress concentration region, the wiring prohibited region 7(A) in the vicinity of the support balls 5 is defined as a region extending in the X (transverse) direction from the support balls 5 a distance corresponding to two ball land (0.8 mm), and extending in the Y (vertical) direction up and down from each of the support balls 5 a distance corresponding to one ball land. Since two support balls are disposed with a center-to-center distance of 0.8 mm, the length in the Y (vertical) direction corresponds to five ball lands (2.0 mm). This means that the wiring prohibited region 7(A) has dimensions of about 0.8 mm by 2.0 mm. The wiring prohibited region 7(B) at the semiconductor chip end extends, crossing over the semiconductor chip end, and has a dimension in the X (transverse) direction corresponding to one ball land (0.4 mm), and a dimension in the Y (vertical) diction corresponding to five ball lands (2.0 mm), being extended up and down from the support balls 5 a distance corresponding to one ball land each, similarly to the wiring prohibited region 7(A). Thus, the wiring prohibited region 7(A) has dimensions of about 0.4 mm by 2.0 mm.

Since the regions to prohibit formation of the wiring lines are the regions 7(A) and 7(B), it is possible to form wiring lines between the support balls 5 in the upper half and the support balls 5 in the lower half of the overall plan view of FIG. 5(A).

The breakage of the surface layer wiring lines on the package substrate will not occur when the sizes of the package substrate and the semiconductor chip are substantially identical and no support balls are arranged, and when the support balls are located below the region in the package substrate occupied by the semiconductor chip. Judging from the mechanism described above, it is believed that the breakage of the surface layer wiring lines on the package substrate occurs when the package substrate 2 is greater than the semiconductor chip 1 and the support balls 5 are disposed in a region on the package substrate outside the contour defined by the outline of the semiconductor chip 1. The present invention is effectively applicable when the distance in the X (transverse) direction between the installation end of the semiconductor chip 1 and the center of the support ball 5 is a distance corresponding to the diameter of the ball land (0.4 mm) or greater. This upper limit of the distance is set for the reason that the use of a package substrate having greater dimensions will increase the cost of production, whereas there is no limit technically.

The semiconductor device according to the first embodiment is a moldless flip chip BGA, in which the package substrate 2 having the semiconductor chip 1 mounted face-down is bonded to the module substrate 3. The package substrate 2 is greater than the semiconductor chip 1 and the support balls are provided on the substrate in a region outside the semiconductor chip. The vicinity of the support balls 5 and the package substrate region at the end of the semiconductor chip facing the support ball 5, which constitute the stress concentration regions of the package substrate, are defined as the wiring prohibited region 7(A) and the wiring prohibited region 7(B), respectively. The wiring lines are routed while avoiding the stress concentration regions to reduce the stress applied to the wiring lines, whereby the breakage of the wiring lines can be prevented. The first embodiment of the present invention thus can provide a semiconductor device having increased reliability for conductive wiring lines, which is capable of preventing the breakage of the package surface layer wiring lines.

Figure 7:
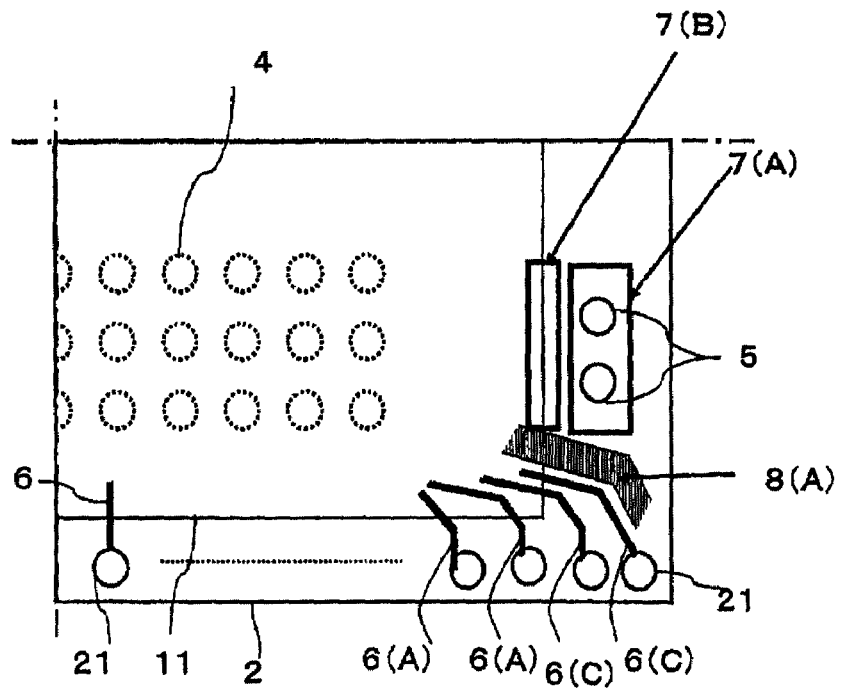
FIG. 7 is a partial plan view showing a second embodiment of the present invention.

According to a second embodiment, a wide wiring line is employed in the wiring prohibited regions of the first embodiment. In FIG. 7, like components to those of the first embodiment are identified with like reference numerals, and detailed description thereof will be omitted. In FIG. 7, the indication of the module substrate is omitted.

Referring to FIG. 7, a wide wiring line is provided close to the stress concentration regions. Specifically, a wide wiring line 8(A) is disposed between the wiring prohibited regions 7(A) and 7(B) which are the stress concentration regions and the package surface layer wiring lines 6(C) formed to avoid the wiring prohibited regions. The wide wiring line 8(A) may be formed in contact with the wiring prohibited regions 7(A) and 7(B). Whereas an ordinary wiring line has a width of several tens of micrometers, the wide wiring line has a width of 200 µm or greater to increase the rigidity of the package substrate 2. Not only the surface layer wiring lines on the package substrate 2 but also inner-layer wiring lines and rear-surface layer wiring lines may be formed as wide wiring lines or solid wiring lines, so that the rigidity of the package substrate 2 can be further increased to improve the stress reduction effect.

Figure 8:
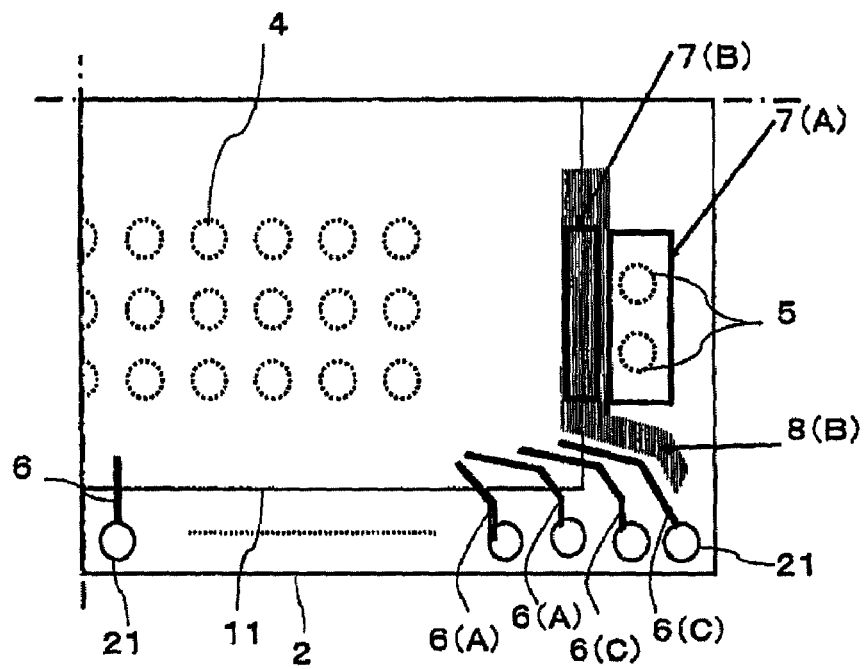
FIG. 8 is a partial plan view showing a third embodiment of the present invention.

FIG. 8 shows a third embodiment, in which a wide wiring line is formed in the wiring prohibited region 7(B) where stress is concentrated and no wiring line with an ordinary width can be formed. More specifically, a wide wiring line 8(B) is formed between the wiring prohibited region 7(A) that is a stress concentration region and the package surface layer wiring line 6(C) which is formed away from this wiring prohibited region. The wide wiring line 8(B) is formed to include the wiring prohibited region 7(B) therein. The width of the wide wiring line is set here to 200 µm or greater to enhance the rigidity of the package substrate 2. The width of the wiring portion including the wiring prohibited region 7(B) may be set even wider to 400 µm or greater. Further, not only the surface layer wiring lines of the package substrate 2 but also inner-layer wiring lines and rear-surface layer wiring lines may be formed as wide wiring lines or solid wiring lines so that the rigidity of the package substrate 2 can be further increased to enhance the stress reduction effect.

Figure 9:
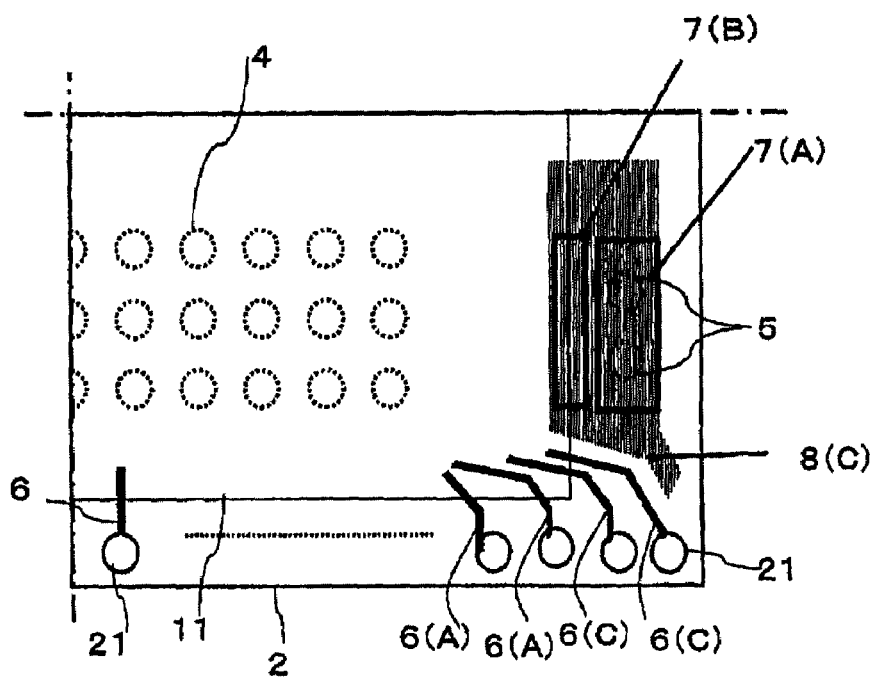
FIG. 9 is a partial plan view showing a fourth embodiment of the present invention.

FIG. 9 shows a fourth embodiment of the present invention, in which a wide wiring line 8(C) is formed to include the regions 7(A) and 7(B) which are stress concentration regions and prohibit formation of wiring lines with an ordinary width. The width of the wide wiring line is set here to 200 µm or greater to increase the rigidity of the package substrate 2, while the width of the wiring portion including the wiring prohibited regions 7(A) and 7(B) may be set to 800 μm or greater. Further, not only the surface layer wiring lines of the package substrate 2 but also inner-layer wiring lines and rear-surface wiring lines may be formed as wide wiring lines or solid wiring lines so that the rigidity of the package substrate 2 can be further increased to enhance the stress reduction effect.

The wide wiring lines according to the second to fourth embodiments may be used as power supply wiring lines, ground wiring lines, or reference voltage lines. They can also be used as signal wiring lines when a signal is output from a driver with great drive capacity. The formation of the wide wiring line in the wiring prohibited region increase the rigidity of the package substrate, and thus the wiring as a whole will not be broken if breakage occurs in a part thereof. The fourth embodiment also provides a semiconductor device having increased reliability for conductive wiring lines, which is capable of preventing the breakage of the package surface layer wiring lines.

The description of the embodiments above has been made in terms of breakage of the substrate surface layer wiring lines of the lower package in a multi-chip module and countermeasures thereto. The lower package substrate having a chip mounted on the upper surface thereof has configuration in which signal balls are disposed in a region defined by the chip outline on the lower surface thereof, while support balls are disposed outside the region defined by the outline, so that these balls are bonded to the module package to support the lower package substrate. The signal balls on the upper package are disposed outside the region defined by the chip on the upper package substrate, and not in the inside of the region defined by the chip. This means that the balls are not disposed both inside and outside the region defined by the chip outline. Therefore, it is not so important in the upper package as in the lower package to give consideration to breakage of the surface layer wiring lines. However, as for a stacked package which requires to arrange means for supporting the upper package substrate also in the inside of the region defined by the chip outline of the upper package in order to prevent deformation of the substrate, there occurs a problem of breakage of the surface layer wiring lines in the upper package. The embodiments described below provide a solution to wiring breakage with respect to the positions and types of the surface layer wiring lines in the upper package.

Figure 10:
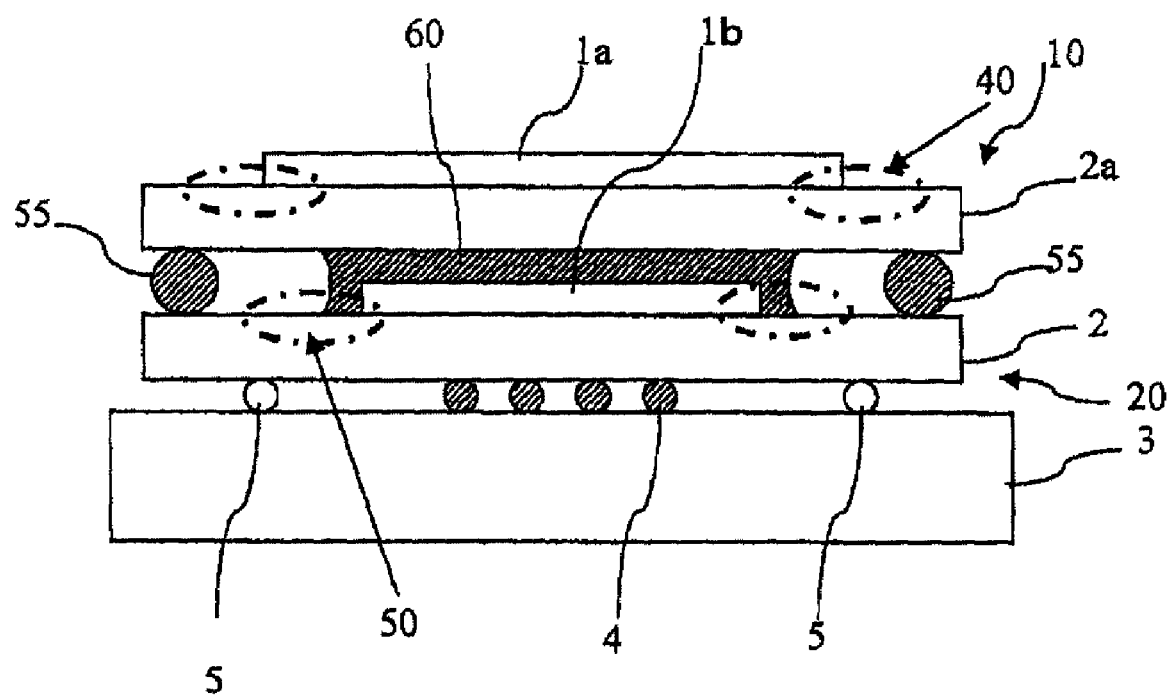
FIG. 10 is a schematic diagram for explaining a fifth embodiment of the present invention.

FIG. 10 is a schematic diagram showing a fifth embodiment of the present invention. In FIG. 10, those components indicated by similar reference numerals to those of the embodiments described above have similar functions thereto. Therefore, the description of these components will be omitted and description will be made focusing on differences from the embodiments above.

Referring to FIG. 10, balls 55 functions as the signal balls and the support balls hold a substrate 2*a* of an upper package 10 outside a region defined by the outline of a chip 1*a*. At the same time, an interlayer adhesive is applied to fill a space between the lower surface of the substrate 2*a* and a lower package substrate 2 in the region defined by the chip outline of the package substrate 2*a*, whereby the upper package substrate 2*a* is fixed and supported. According to this configuration, when the multi-module package is exposed to temperature change, stress is concentrated not only to the surface layer wiring lines indicated by 50 on the lower package substrate but also to the places indicated by 40. The surface layer wiring lines are therefore formed to bypass these places. Alternatively, a wide wiring line may be formed in these places.

Figure 11:
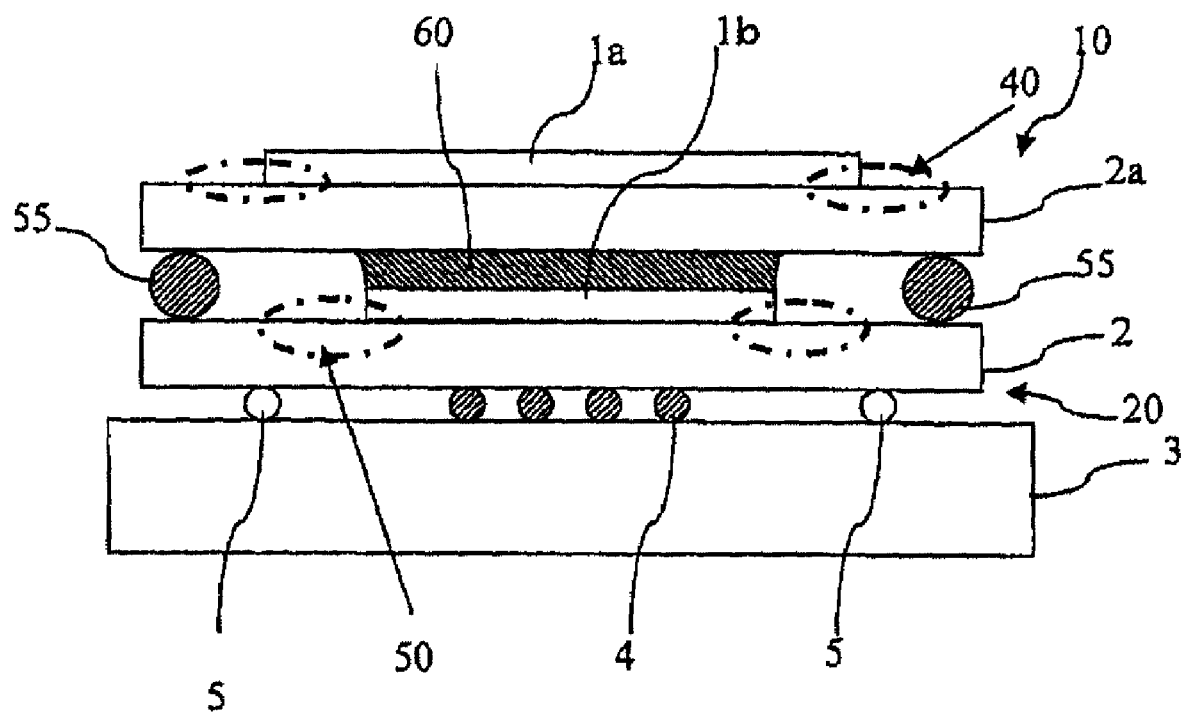
FIG. 11 is a schematic diagram for explaining a sixth embodiment of the present invention.

FIG. 11 is a schematic diagram showing a sixth embodiment of the present invention. In FIG. 11, those components indicated by similar reference numerals to those of the embodiments described above have similar functions thereto. Therefore, the description of these components will be omitted and description will be made focusing on differences from the embodiments above.

According to the sixth embodiment, an interlayer adhesive 60 is applied to fill the space between a lower package chip and an upper package substrate to hold an upper package. Also in this case, surface layer wiring lines are formed to bypass places 40, or a wide wiring line is formed.

Figure 12:
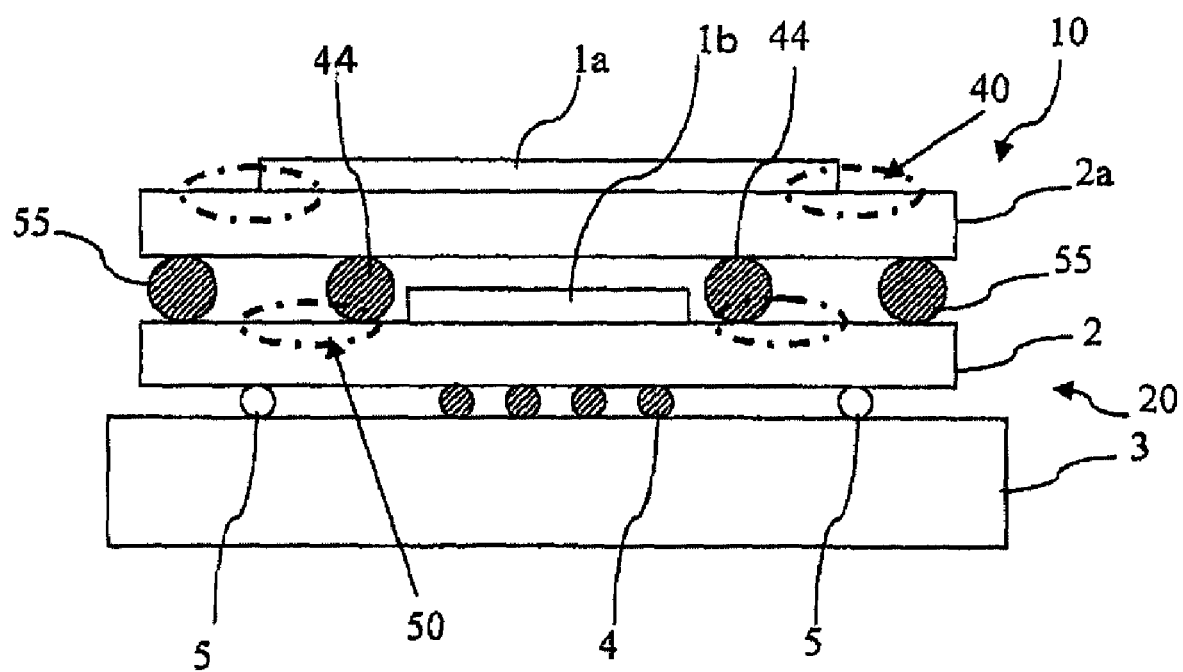
FIG. 12 is a schematic diagram for explaining a seventh embodiment of the present invention.

FIG. 12 is a schematic diagram showing a seventh embodiment of the present invention. In FIG. 12, those components indicated by similar reference numerals to those of the embodiments described above have similar functions thereto. Therefore, the description of these components will be omitted and description will be made focusing on differences from the embodiments above.

In FIG. 12, an upper package 10 is supported not only by signal balls 55 arranged outside a region defined by the outline of a chip 1*a*, but also by signal balls 44 arranged inside the region defined by the chip outline. The signal balls 44 not only function as a support but also electrically connect an upper package substrate to a lower package substrate. Also according to this configuration, the upper package is supported by the fixing points consisting of the signal ball 44 and the signal ball 55, and hence stress is concentrated to places 40 located between these fixing points. Therefore, the upper package substrate is provided with surface layer wiring lines bypassing the places 40 or with a wide wiring.

The present invention has been specifically described in terms of embodiments. However, the present invention is not limited to these embodiments but may be otherwise variously embodied within the scope of the invention. For example, although the description of the embodiments above has been made in terms of a semiconductor device having a semiconductor chip mounted on a package substrate, a capacitor chip may be mounted instead of the semiconductor chip. An electronic component may be used which has a structure in which a semiconductor chip and a capacitor chip are mounted on individual package substrates and these substrates are stacked. Although the description of the embodiments above has been made in terms of a semiconductor memory chip as a semiconductor chip, the chip may be an analog IC, an MEMS (Micro-Electro-Mechanical Systems) chip, or even an optical semiconductor chip. The present invention is particularly effective in case of an MEMS or optical semiconductor chip, because no underfill can be applied between the chip and the package substrate. Also in this case, an electronic component having a structure in which various chips are combined may be used.

Further, the description of the embodiments has been made in terms of stacked multi chip packages. However, the present invention is not limited to the stacked packages, is effectively applicable to a package in which fixing members for supporting a package substrate are arranged in a region on the lower surface of the substrate corresponding to the contour of a chip on the substrate, while support balls are arranged outside the region, and surface layer wiring lines are formed to connect the inside and the outside of the contour.

The invention claimed is:

1. An electronic component having an electronic element chip mounted on a package substrate, comprising:

a first ball for supporting the package substrate, the first ball being disposed on a surface of the package substrate inside a first region wherein the package substrate and the electronic element chip are coextensive; and a second ball for supporting the package substrate, the second ball disposed on the package substrate outside the first region;

a plurality of wiring lines with an ordinary width formed on the package substrate inside the first region extending from said first region to a second region outside of the first region, wherein none of the wiring lines are formed in a third region substantially above the second ball.

2. The electronic component according to claim 1, comprising a module substrate fixing the package substrate by means of the first ball and the second ball.

3. The electronic component according to claim 1, wherein none of the wiring lines are formed in a fourth region substantially below a border of the first region at a position adjacent the second ball.

4. The electronic component according to claim 3, wherein the first ball is a signal ball for conducting electricity, and the second ball is a support ball.

5. The electronic component according to claim 4, wherein the support ball is arranged outwardly away from the border of the first region by a distance corresponding to a diameter of a ball land provided for the support ball on the package substrate.

6. The electronic component according to claim 5, wherein the third region has dimensions corresponding to two ball lands on the surface of the package substrate extending from the center of the support ball in a first direction away from the border of the first region and corresponding to three ball lands on the surface of the package substrate including one ball land each extending vertically up and down from the support ball in a second direction orthogonal to the first direction.

7. The electronic component according to claim 6, wherein the second region has dimensions corresponding to one ball land on the surface of the package substrate in the first direction and corresponding to three ball lands on surface of the package substrate in the second direction, with the center of the fourth region being positioned on the border of the first region.

8. The electronic component according to any of claims 4 to 7, wherein a wide wiring line with a width greater than an ordinary width is disposed adjacent to the first and second regions.

9. The electronic component according to any of claims 4 to 7, wherein a wide wiring line with a width greater than an ordinary width is disposed in the second region.

10. The electronic component according to any of claims 4 to 7, wherein a wide wiring line with a width greater than an ordinary width is disposed in the first and second regions.

11. The electronic component according to claim 8, wherein the wide wiring line is a power supply wiring line, a ground wiring line, or a reference voltage wiring line.

12. The electronic component according to claim 10, wherein the wide wiring line has a width of 200 µm or greater.

13. The electronic component according to claim 1, comprising an upper package stacked above the package, wherein the upper package comprises:

an upper package substrate having an electronic element chip mounted thereon;

upper package substrate supporting means disposed on the rear surface of the upper package corresponding to the inside of the contour defined by the outline of the electronic element chip; and a signal ball located outside the contour defined by the outline of the electronic element chip to support the upper package substrate, and wherein no wiring line with an ordinary width is formed in a first region on the surface of the upper package substrate corresponding to the vicinity of the position of the signal ball or a second region located on the surface of the upper package substrate in the vicinity of the contour defined by the outline of the electronic element chip.

14. The electronic component according to claim 13, wherein the upper package supporting means is an adhesive applied to fill the space between the package and the upper package.

15. The electronic component according to claim 13, wherein the upper package supporting means is a signal ball disposed between the package and the upper package.

16. The electronic component according to claim 14 or 15, wherein a wide wiring line with a width greater than an ordinary width is disposed close to the first and second regions of the upper package.

17. The electronic component according to claim 14 or 15, wherein a wide wiring line with a width greater than an ordinary width is disposed in the second region of the upper package.

18. The electronic component according to claim 14 or 15, wherein a wide wiring line with a width greater than an ordinary width is disposed in the first and second regions of the upper package.

19. An electronic component comprising:

a substrate;

an electronic chip mounted on the substrate;

a first ball disposed on the substrate within a first region of the substrate that is coextensive with the electronic chip;

a second ball disposed on the substrate outside of the first region; and a plurality of wiring lines having a width of 100 µm or less formed on the substrate, extending from a position inside the first region to a position inside a second region outside the first region, wherein none of the wiring lines extend substantially in the vicinity of the second ball.

20. The electronic component according to claim 1, wherein the first ball and the second ball are disposed on a rear surface of the package substrate.

21. The electronic component according to claim 1, wherein the wiring lines comprise surface layer wiring lines formed on the package substrate.

* * * * *